United States Patent
Hirai et al.

(10) Patent No.: US 6,703,676 B2
(45) Date of Patent: Mar. 9, 2004

(54) MAGNETIC MEMORY DEVICE AND MANUFACTURING METHOD THEREOF

(75) Inventors: Tadahiko Hirai, Kanagawa (JP); Naoki Nishimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/235,810

(22) Filed: Sep. 6, 2002

(65) Prior Publication Data

US 2003/0080391 A1 May 1, 2003

(30) Foreign Application Priority Data

Sep. 7, 2001 (JP) ........................ 2001/272574

(51) Int. Cl.⁷ .......................... H01L 29/82; H01L 43/00
(52) U.S. Cl. ........................ 257/421; 257/295
(58) Field of Search .................. 257/421, 295

(56) References Cited

U.S. PATENT DOCUMENTS

| | | | |
|---|---|---|---|
| 5,173,873 A | * 12/1992 | Wu et al. | 365/173 |
| 6,055,179 A | 4/2000 | Koganei et al. | 365/158 |
| 6,104,632 A | 8/2000 | Nishimura | 365/158 |
| 6,219,275 B1 | 4/2001 | Nishimura | 365/173 |
| 6,438,025 B1 | * 8/2002 | Skarupo | 365/158 |
| 2002/0057594 A1 | 5/2002 | Hirai | 365/171 |
| 2002/0145905 A1 | 10/2002 | Hirai | 365/158 |
| 2002/0167059 A1 | 11/2002 | Nishimura et al. | 257/421 |
| 2003/0002330 A1 | 1/2003 | Nishimura | 365/158 |

* cited by examiner

Primary Examiner—Hoai Ho
Assistant Examiner—Tu-Tu Ho
(74) Attorney, Agent, or Firm—Fitzpatrick, Cella, Harper & Scinto

(57) ABSTRACT

TMR elements in a magnetic memory device are formed to be flat to enable their stable operations. A TMR element is formed by putting a tunnel barrier layer being a non-magnetic layer between an upper magnetic layer and a lower magnetic layer, both having a perpendicular magnetic anisotropy. A conductive local connect elongating in a plane is formed on a second plug formed in a contact hole formed in a second and a third inter-layer insulating films. The TMR element is formed on the local connect at a position avoiding a position right above the second plug. The TMR element is connected with the upper surface of the second plug through the local connect. A bit line through which an electric current for applying a magnetic field to the TMR element flows is formed at a position shifted from a position right above the TMR element in a plane.

13 Claims, 18 Drawing Sheets

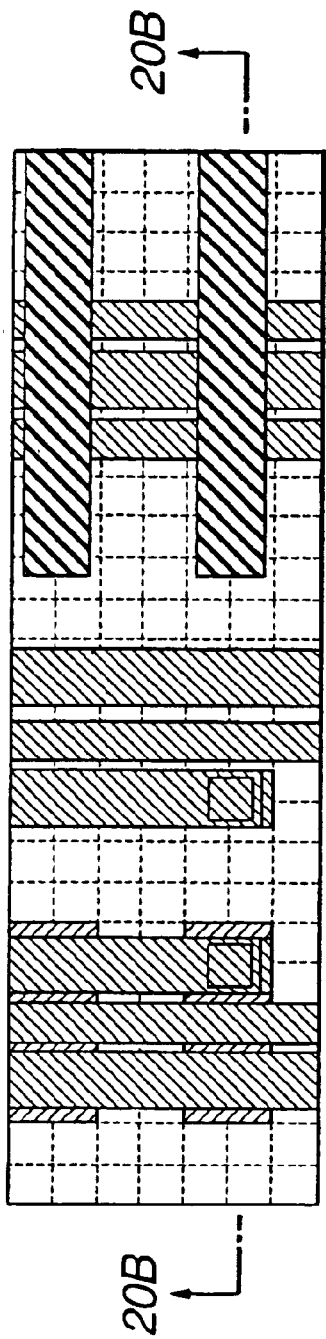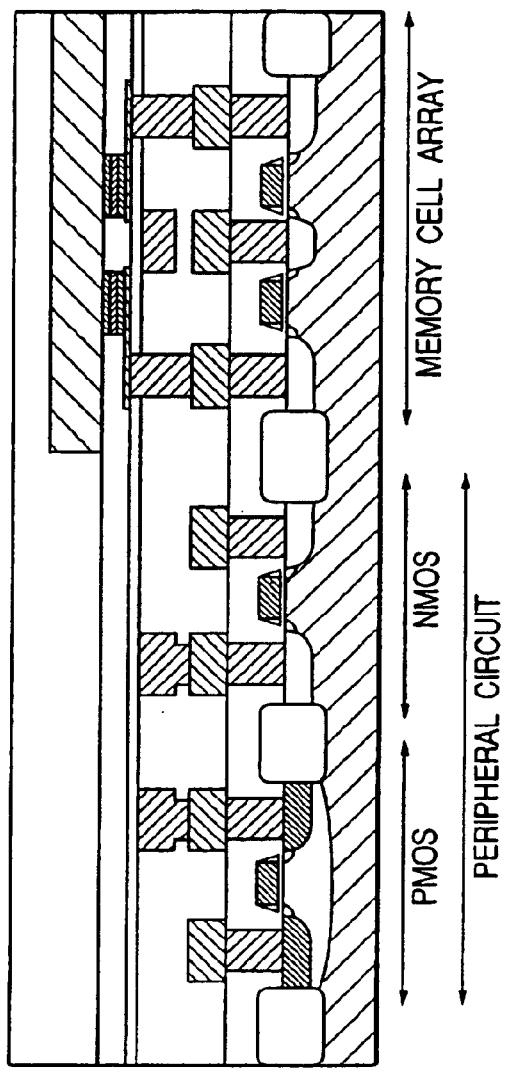

MAGNETIC MEMORY DEVICE AND MANUFACTURING METHOD THEREOF

BACKGROUND OF THE INVENTION

1. Field of the Invention

The present invention relates to a magnetic memory device being a nonvolatile solid-state memory using magnetoresistive elements, and to a manufacturing method thereof.

2. Description of Related Art

In recent years, semiconductor memory devices being solid-state memories have widely been used for information equipment and the like. The kinds of the semiconductor memory devices are various such as a dynamic random access memory (DRAM), a ferroelectric random access memory (FeRAM), and an electrically erasable programmable read-only memory (EEPROM). The characteristics of such semiconductor memory devices have both merits and demerits, and it is difficult for the conventional semiconductor memory devices to meet all of the specifications required by the present information equipment.

Accordingly, a magnetic memory device (a magnetic random access memory (MRAM)) using magnetoresistive elements has been researched and developed in recent years. Because the magnetic memory device uses magnetic films for storing information, the magnetic memory device has nonvolatility being a feature such that the stored information is not erased even if the power supply to the magnetic memory device is turned off. And the magnetic memory device is expected to meet all of the specifications required by various pieces of information equipment with respect to various characteristics such as a recording time, a readout time, a recording density, the capable number of times of rewriting, and electric power consumption.

The magnetic memory device is provided with the magnetoresistive elements as its memory cells. Spin dependent tunneling magnetoresistive elements (TMR elements) are suitably used as such magnetoresistive elements. The TMR element has the basic structure composed of two magnetic layers and a thin non-magnetic layer put between them for storing information. The magnetoresistive ratio (MR ratio) of the TMR element is larger than that of other magnetoresistive elements, and the value of resistance of the TMR element can be set at a value within a range from several kΩ to several tens kΩ which is the most suitable value as the value of resistance of a memory cell of the magnetic memory device. Consequently, the TMR elements are generally used as memory elements of the magnetic memory device.

The value of the resistance of the TMR element differs in the case where the pieces of magnetization of the magnetic layers with the non-magnetic layer put between them are parallel to each other (see FIG. 14A) and in the case where the pieces of magnetization of them are anti-parallel to each other (see FIG. 14B). Accordingly, the two states can be stored as logical values "0" and "1", respectively. The states of the logical values "0" and "1" can be stored by, for example, fixing the direction of the magnetization of one of the two magnetic layers and by changing the direction of the magnetization of the other of the two magnetic layers by external magnetic fields. The operation is the so-called information writing operation. The method is known which uses the magnetic fields generated by an electric current flowing through the wiring disposed in the vicinity of the TMR element for changing the direction of the magnetization.

Then, the value of the resistance of the TMR element is obtained by detecting the voltage or the current of the TMR element. The states of the logical values "0" and "1" can be distinguished on the basis of the value of the resistance. The operation is the so-called information readout operation. To put it more concretely, the following two detection methods are known: the absolute detection method distinguishing the states of the logical values "0" and "1" on the basis of the absolute value of the resistance, and the differential detection method reading the states of the logical values "0" and "1" by applying a magnetic field weaker than that at the time of writing to cause the magnetization reversal of only the magnetic layer having a smaller coercive force.

The TMR element using the so-called in-face magnetization films magnetized in the direction parallel to the surfaces of the magnetic layers as shown in FIGS. 14A and 14B has the following problem in the case where the size of the element is made to be small. That is, when the size of the TMR element is made to be small, demagnetizing fields (self attenuation magnetic fields) are generated in the magnetic layers and the curling of the magnetization is also generated at the end surfaces thereof. Thereby, the magnetization direction of the magnetic layer to record and hold information is not determined in a fixed direction to be instable. Consequently, it becomes impossible for the TMR element to hold the information owing to the decrease of the magnetoresistance ratio (MR ratio) thereof caused by the instability of the magnetization direction and the like. Hence, the TMR element of the type of in-face magnetization has the limitations of the miniaturization and the large scale integration of the memory device using the TMR elements owing to the impossibility of the holding of information in case of making the sizes of the TMR elements too small.

U.S. Pat. No. 6,219,275 discloses a TMR element using the so-called perpendicular magnetic anisotropy film in which magnetization is made in the direction perpendicular to the surfaces of magnetic layers (see FIGS. 15A and 15B) for solving the above-mentioned problem. The perpendicularly magnetized TMR element does not generate large demagnetizing fields even if the size of the TMR element is made to be small, and can hold information stably. Consequently, the perpendicularly magnetized TMR elements can constitute a magnetic memory device smaller in size and more highly integrated than that composed of the TMR elements of the type of the in-face magnetization.

In the case where a magnetic memory device is composed by the use of the above-mentioned TMR elements, it is general to adopt the structure in which the TMR elements are laminated on metal oxide semiconductor field effect transistors (MOSFET's). To put it concretely, the magnetic layers of the TMR elements are connected with the drain regions of the MOSFET's through conductive members such as metal plugs.

A conventional magnetic memory device has the problem in which it is difficult to form non-magnetic layers located between magnetic layers to be flat. In such a case, the problem may be produced in which magnetization directions of the upper and the lower magnetic layers of a memory cell in such a magnetic memory device cannot be formed in an ideally parallel state or an ideally anti-parallel state. In particular, in the case where the tunneling barrier layer of a TMR element is not flat, unevenness of film thickness is produced to generate a leakage current. The leakage current causes the decrease of the MR ratio in turn. Moreover, in the case where the magnetization directions of the upper and the lower magnetic layers is not in the ideally parallel state or the ideally anti-parallel state, the spin polarizability of the interfaces of the tunneling barrier layer decreases also to decrease the MR ratio. That is, it becomes impossible to obtain stable changes of the magnetoresistance of the TMR element.

SUMMARY OF THE INVENTION

Accordingly, the present invention aims to provide a magnetic memory device having the following characteristics, and a manufacturing method thereof. That is, the surface roughness of the magnetoresistive elements laminated on the conductive members of the magnetic memory device is small, and the magnetic layers and the non-magnetic layers of the magnetic memory device are flat. Moreover, in the magnetic memory device using TMR elements particularly, the leakage current is suppressed, and the MR ratio thereof is high.

A feature of the present invention exists in a point that in a non-volatile magnetic memory device including a magnetoresistive element composed of a first and a second magnetic layers being magnetized chiefly in a direction perpendicular to film surfaces and a non-magnetic layer located between the first and the second magnetic layers, the magnetoresistive element being connected with a conductive plug, wherein the magnetoresistive element is disposed at a position distant from a position right above the plug in a plane, and a local connect is provided for connecting an upper surface of the plug and a lower surface of the magnetoresistive element.

It is preferable that the local connect is made of titanium or titanium nitride.

The plug may be made of tungsten or copper, and may be formed to penetrate the insulating film substantially perpendicularly.

It is preferable that the magnetic memory device further comprises a bit line located above the magnetoresistive element for applying a magnetic field to the magnetoresistive element and the magnetic field is applied in an easy axis direction of magnetization of the magnetic films.

It is preferable to locate the magnetoresistive element at a position shifted from a principal wiring part of the bit line in a plane.

It is preferable that the non-magnetic layer is an insulator.

It is preferable that the magnetic memory device further comprises wiring for applying a magnetic field in the in-face direction to the magnetic films to apply a magnetic field generated by the wiring and the magnetic field generated by the bit line and thereby the magnetization of at least one of the first and the second magnetic films is reversed.

Another feature of the present invention exists in a manufacturing method of a non-volatile magnetic memory device including a magnetoresistive element composed of a first and a second magnetic layers being magnetized chiefly in a direction perpendicular to film surfaces and a non-magnetic layer located between the first and the second magnetic layers, the magnetoresistive element being connected with a conductive plug, the method comprising the steps of: forming the plug; forming a conductive local connect contacting with an upper surface of the plug and extending to a horizontal direction; and forming the magnetoresistive element at a position distant from a position right above an upper surface of the plug in a plane on the local connect.

It is preferable that the local connect is formed by use of titanium or titanium nitride.

The plug may be made of tungsten or copper, and may be formed to penetrate the insulating film substantially perpendicularly.

It is preferable to include the step of forming a bit line above the magnetoresistive element for making an electric current flow therethrough for applying a magnetic field to the magnetoresistive element.

It is preferable to form the bit line at a position shifted from a position right above the magnetoresistive element in a plane.

BRIEF DESCRIPTION OF THE DRAWINGS

FIG. 20A is a plan view of a principal part of a magnetic memory device of a fifth embodiment of the present invention; and FIG. 20B is a sectional view showing the cross section taken along the line 20B—20B in FIG. 20A.

DESCRIPTION OF THE PREFERRED EMBODIMENTS

The attached drawings are referred while the preferred embodiments of the present invention are described.

First Embodiment

Figure 1A:
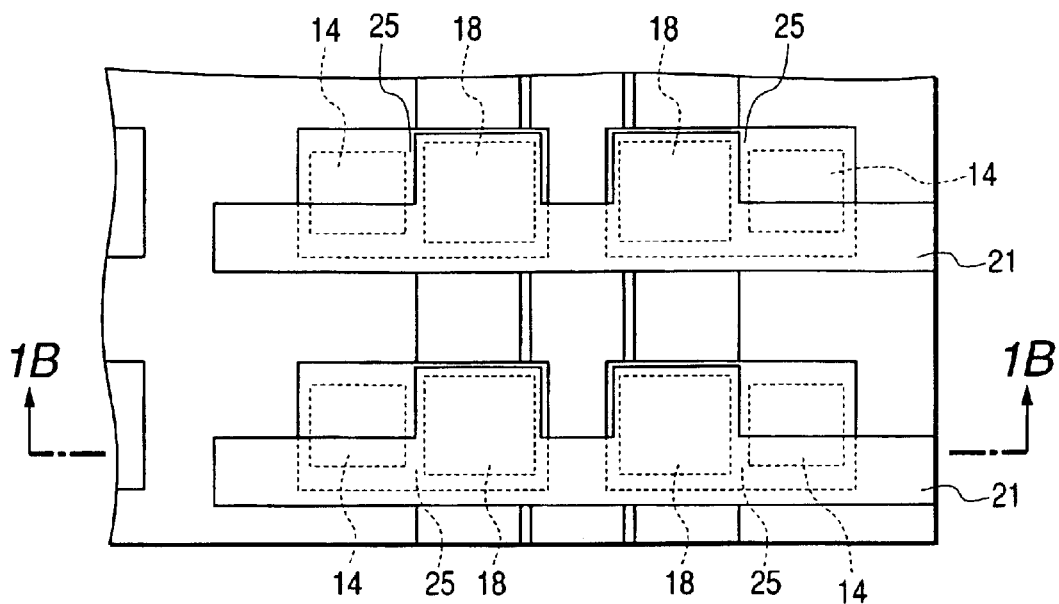
FIG. 1A is a plan view of a principal part of a magnetic memory device of a first embodiment of the present invention.
Figure 1B:
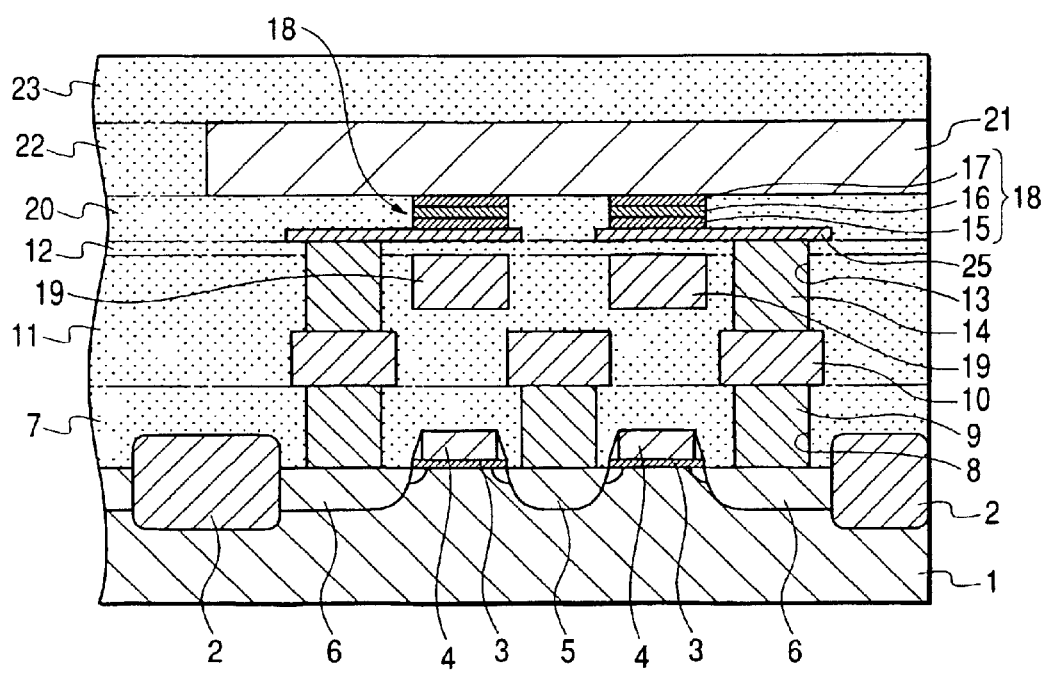
FIG. 1B is a sectional view showing the cross section taken along the line 1B—1B in FIG. 1A.

A description is given to the structure of a magnetic memory device according to the present embodiment which is shown in FIGS. 1A and 1B.

Element isolation regions 2 are formed at predetermined places on a semiconductor substrate 1 made of single crystal silicon. The element isolation regions 2 in the present embodiment are shallow trench isolations (STI's). Then, gate electrodes 4 are formed above the semiconductor substrate 1 with gate insulation films 3 between them. A source region 5 is formed between a pair of gate electrodes 4. A drain region 6 is formed between a gate electrode 4 and an element isolation region 6. Thereby, transistor structures are formed.

A first inter-layer insulating film 7 made of $SiO_2$ is formed on the semiconductor substrate 1 on which the transistor structures are formed in such a way. Contact holes 8 are formed above the source regions 5 and the drain regions 6 to penetrate the first inter-layer insulating film 7. First plugs 9 made of tungsten are formed in the contact holes 8. First metal wiring 10 composed of Ti/AlSiCu/Ti layers is connected to the first plugs 9. Although it is not described in detail, the first metal wiring 10 connected with the source regions 5 through the first plugs 9 is connected with a grounding conductor, and the first metal wiring 10 connected with the drain regions 6 through the fist plugs 9 is connected with a not shown peripheral circuit or an external circuit.

A second and a third inter-layer insulating films 11 and 12 made of $SiO_2$ are further laminated. Contact holes 13 are formed above the drain regions 6 to penetrate the second and the third inter-layer insulating films 11 and 12. Second plugs (conductive member) 14 made of tungsten are formed in the contact holes 13.

Local connects 25 extending in a horizontal direction are formed on the second plugs 14. Then, TMR elements 18 composed of GdFe being lower magnetic layers (second magnetic layers) 15, $AlO_x$ being tunneling barrier layers (non-magnetic layers) 16 and TbFe being upper magnetic layers (first magnetic layers) 17 are formed on the local connects 25. The lower magnetic layers 15 of the TMR elements 18 are connected with the second plugs 14 through the local connects 25. Moreover, the lower magnetic layers 15 are connected with the drain regions 6 through the second plugs 14, the first metal wiring 10 and the first plugs 9. With regard to the plane distribution of the TMR elements 18, the TMR elements 18 are formed to avoid the positions right above the second plugs 14. Consequently, even if irregularities are produced on the upper surfaces of the second plugs 14, the TMR elements 18 are not influenced by the irregularities and are able to be formed to be flat. To put it more concretely, in the case where leveling is performed by the use of, for example, chemical and mechanical polishing (CMP) or the like as a general leveling process, the surfaces of the first inter-layer insulating films 7 and the plugs 14 are leveled at the same time. It is preferable to perform the leveling of the upper surfaces of both of the inter-layer insulating films 7 and the plugs 14 with great accuracy. But, actually, there is the case where the flatness of either of them is prior to the other owing to the characteristics of the selected slurry. In connection with the structure of the present invention, the slurry is frequently selected which is matched with the first inter-layer insulating film 7 having a wider area. In such a case, because it is considerable that irregularities are formed on the upper surfaces of the plugs 14, the structure of the present invention is especially effective.

Second metal wiring 19 made of copper is formed on the upper part of the second inter-layer insulating film 11. The second metal wiring 19 is disposed closely to the TMR elements 18. The second metal wiring 19 is electric wiring for applying assist magnetic fields to the TMR elements 18 in their in-face directions. Then, the upper surface of the second metal wiring 19 is covered by the inter-layer insulating film 12 having the thickness of 200 nm or less. The outer peripheries of the TMR elements 18 are covered by a fourth inter-layer insulating film 20.

Moreover, bit lines 21 made of copper are formed to be connected with the upper magnetic layers 17 of the TMR elements 18. The bit lines 21 are write lines for writing information in the TMR elements 18 by applying magnetic fields in the directions perpendicular to the film surfaces of the TMR elements. The peripheries of the bit lines 21 are covered by a fifth inter-layer insulating film 22 made of $SiO_2$. The upper surface of the fifth inter-layer insulating film 22 is covered by a passivation film (protection film) 23 made of SiN to cover all of the upper surfaces of the fifth inter-layer insulating film 22 and the bit lines 21.

Incidentally, peripheral circuits are formed on the outside of the memory cells which are shown in FIGS. 1A and 1B and have been described above.

In the magnetic memory device, when an electric current flows through a bit line 21, a magnetic field is applied to the upper magnetic layer 17 of a TMR element 18. The magnetization direction of the upper magnetic layer 17 is determined by the magnetic field of the bit line 21. The state of the TMR element 18 is judged whether it is the state of the logical value "0" or the state of the logical value "1" on the basis of whether the magnetization direction of the upper magnetic layer 17 and the magnetization direction, which has been held previously, of the lower magnetic layer 15 of the TMR element 18 coincide with each other or not. That is, information is read out. Incidentally, a magnetic field is also applied to the TMR element 18 by an electric current flowing through the second metal wiring 19. The magnetic field is the so-called assist magnetic field which is applied to the TMR element 18 almost at the same timing of the application of the magnetic filed generated by the bit line 21. The assist magnetic field assists the determination of the magnetization direction by the bit line 21 and improves the efficiency thereof.

Figure 11A:
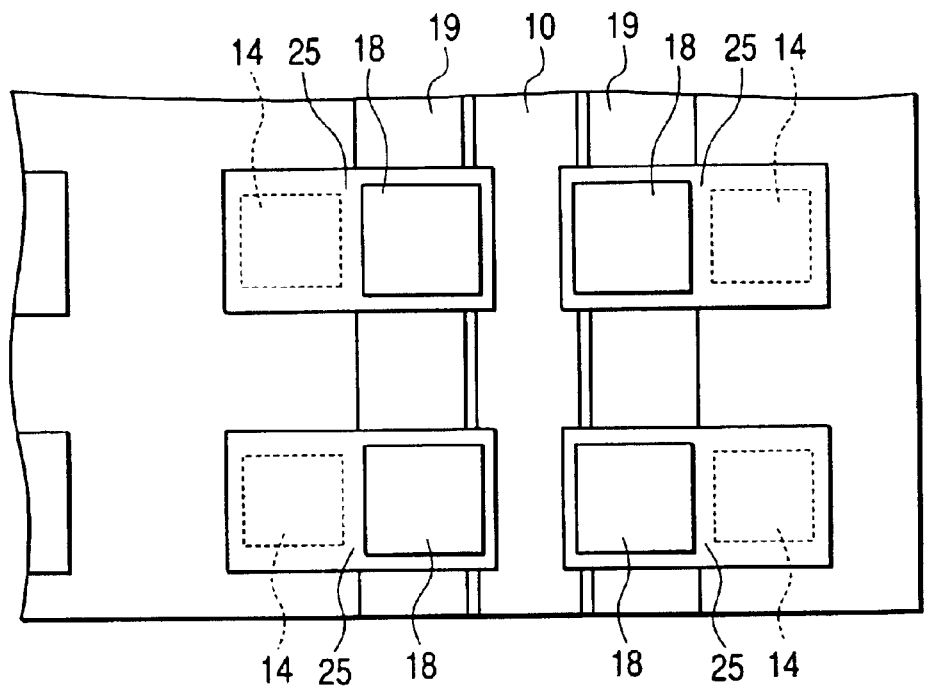
FIG. 11A is a view of a principal part in the manufacturing process of the magnetic memory device of the first embodiment.
Figure 11B:
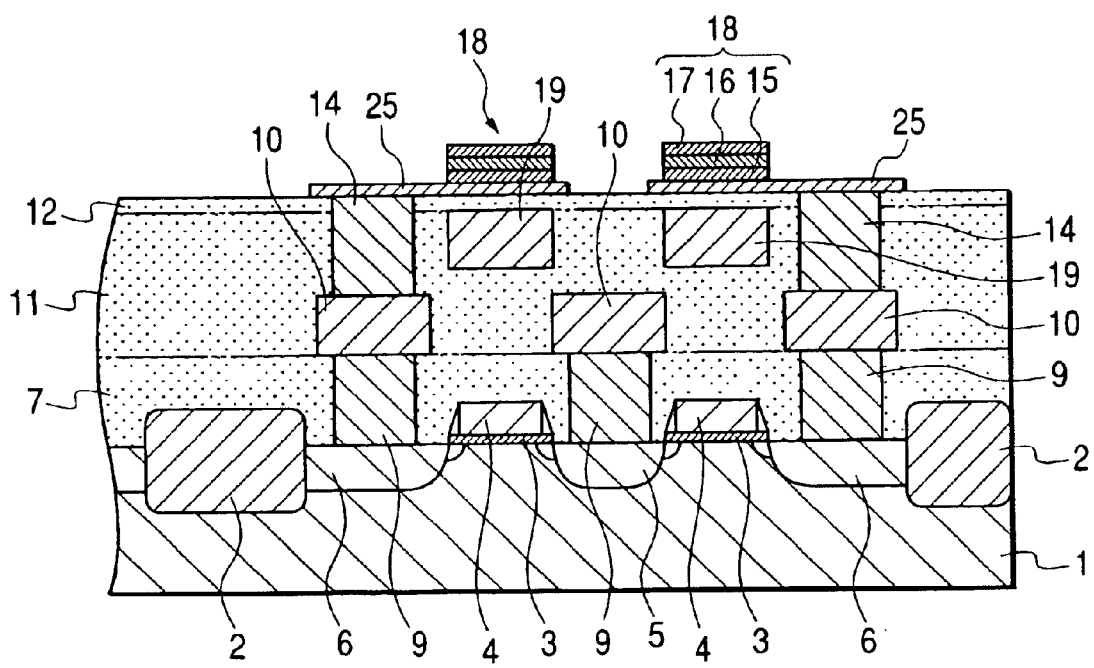
FIG. 11B is a sectional view showing a cross section of the manufacturing process of FIG. 11A.
Figure 12A:
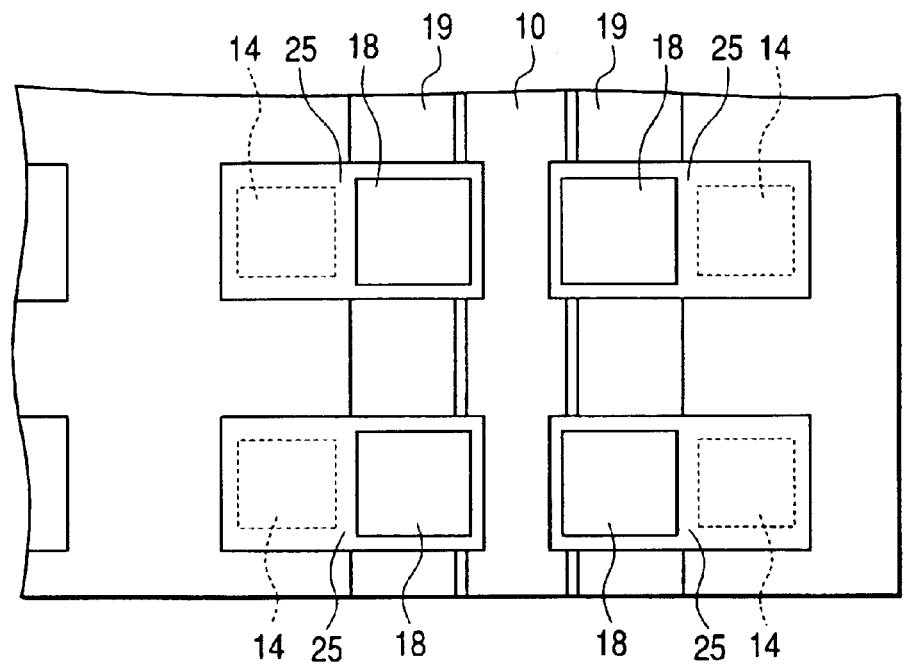
FIG. 12A is a view of a principal part in the manufacturing process of the magnetic memory device of the first embodiment.
Figure 12B:
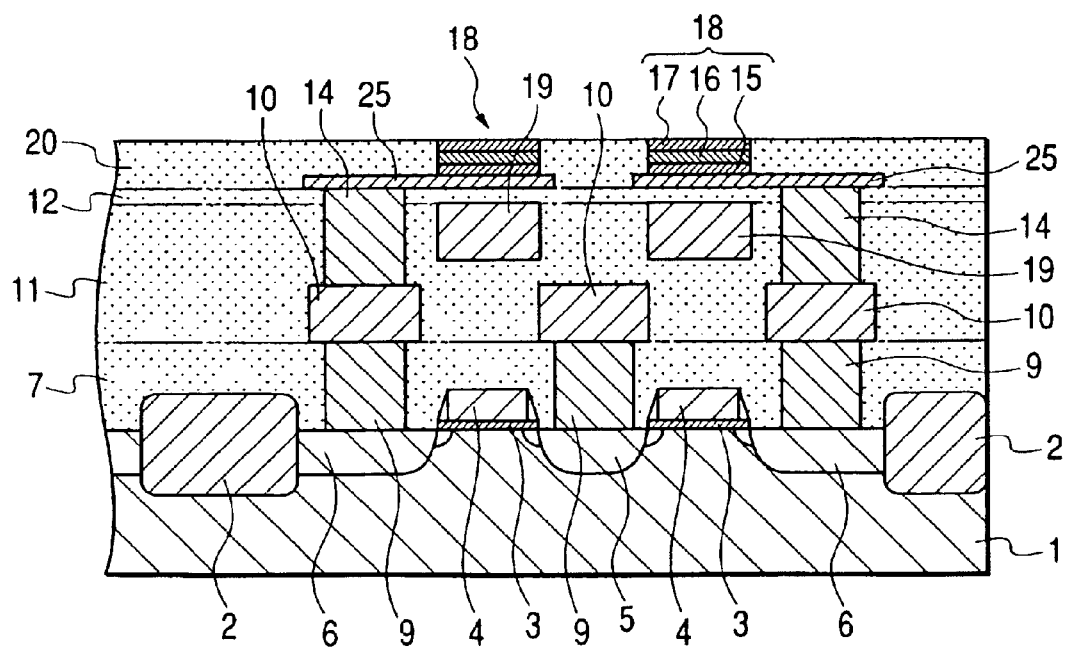
FIG. 12B is a sectional view showing a cross section of the manufacturing process of FIG. 12A.
Figure 13:
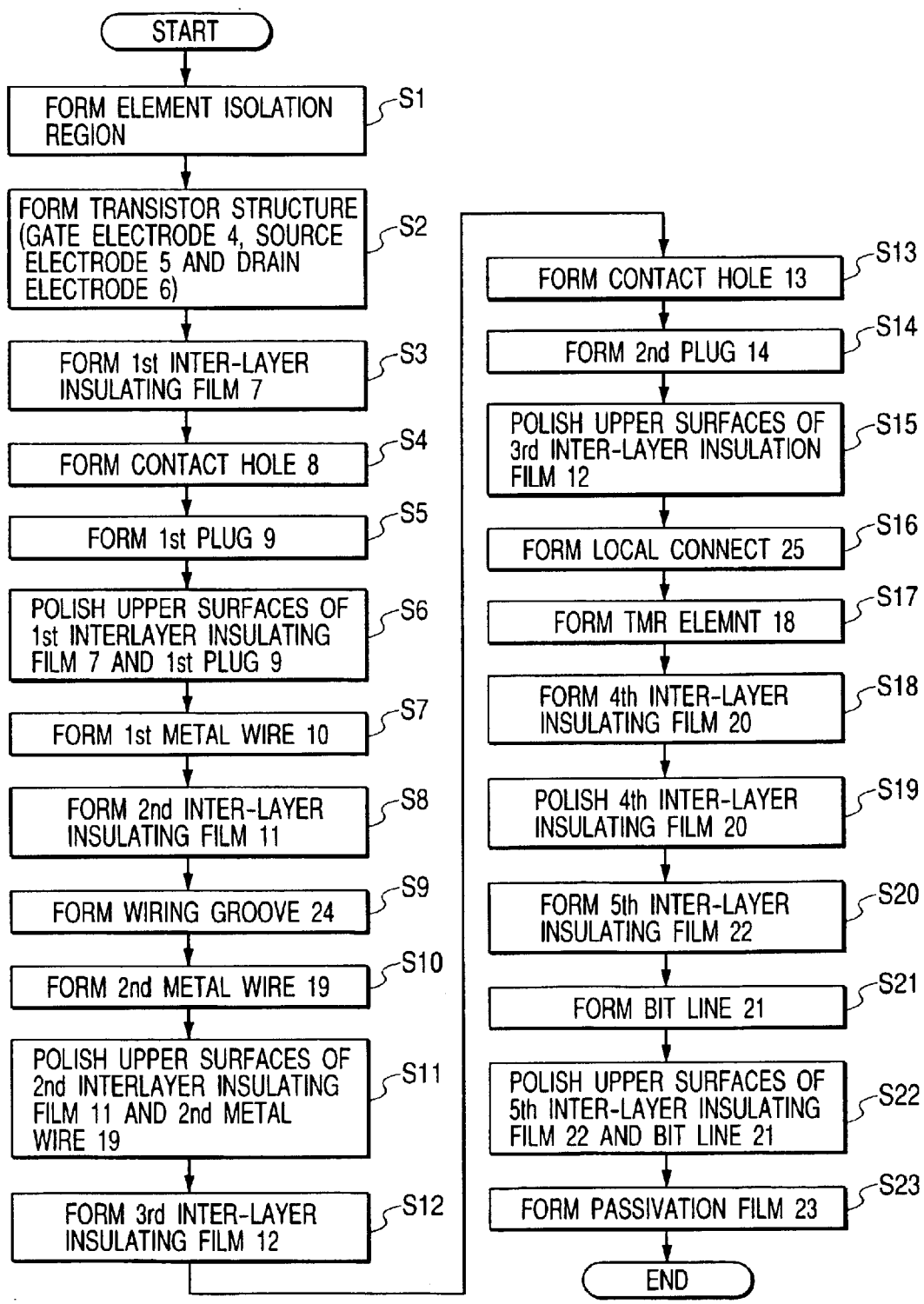
FIG. 13 is a flowchart showing the manufacturing process of the magnetic memory device of the first embodiment.
Figure 14A:
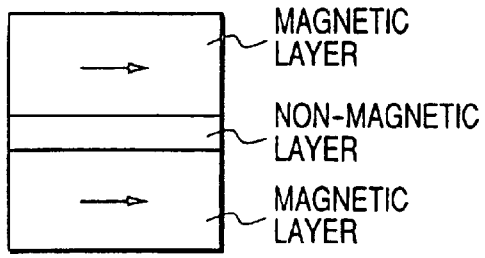
FIGS. 14A and 14B are pattern diagrams of a TMR element of the type of in-face magnetization.
Figure 14B:
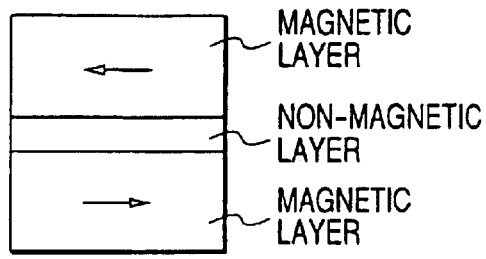
Figure 15A:
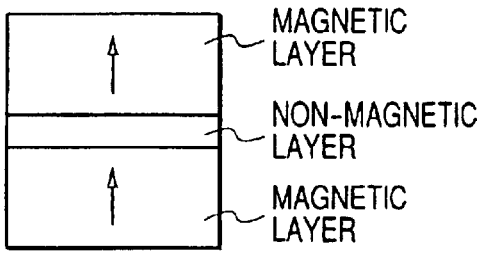
FIGS. 15A and 15B are pattern diagrams of a perpendicularly magnetized TMR element.
Figure 15B:
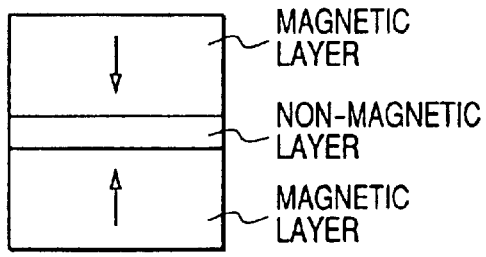

FIGS. 1A, 1B through FIGS. 12A and 12B illustrating each process and the flowchart of FIG. 13 are referred while a manufacturing method of the magnetic memory device is described. Incidentally, FIGS. 1A, 2A, 3A, 4A, 5A, 6A, 7A, 8A, 9A, 10A, 11A and 12A are plan views and show only principal parts by omitting each insulating film and the like for simplification. FIGS. 1B, 2B, 3B, 4B, 5B, 6B, 7B, 8B, 9B, 10B, 11B and 12B are sectional views of cross sections of the magnetic memory device shown in FIGS. 1A, 2A, 3A, 4A, 5A, 6A, 7A, 8A, 9A, 10A, 11A and 12A, respectively.

Figure 2A:
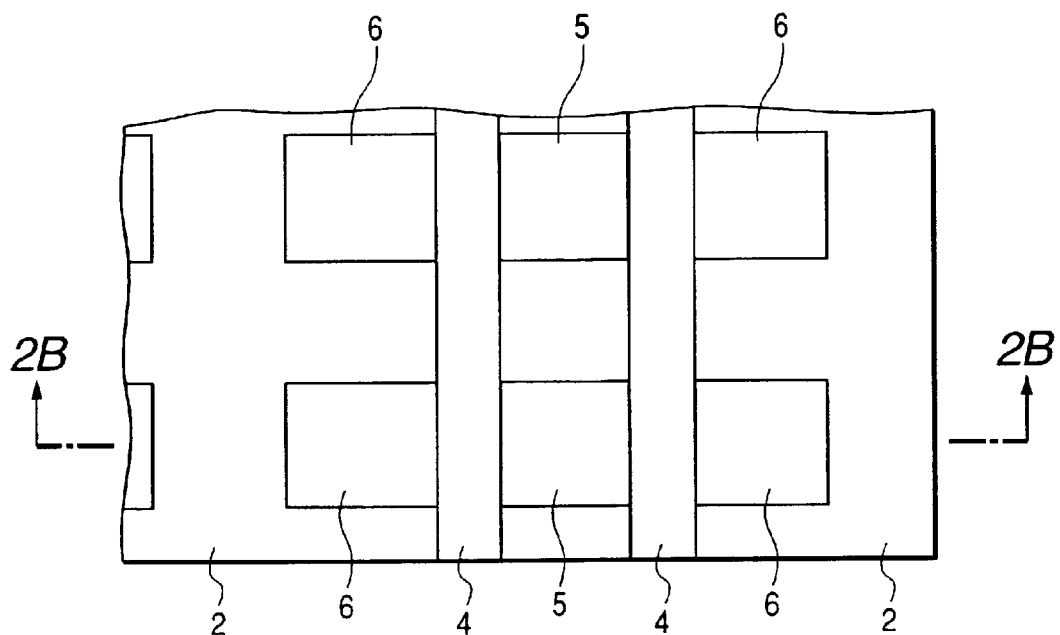
FIG. 2A is a view of a principal part in a manufacturing process of the magnetic memory device of the first embodiment.
Figure 2B:
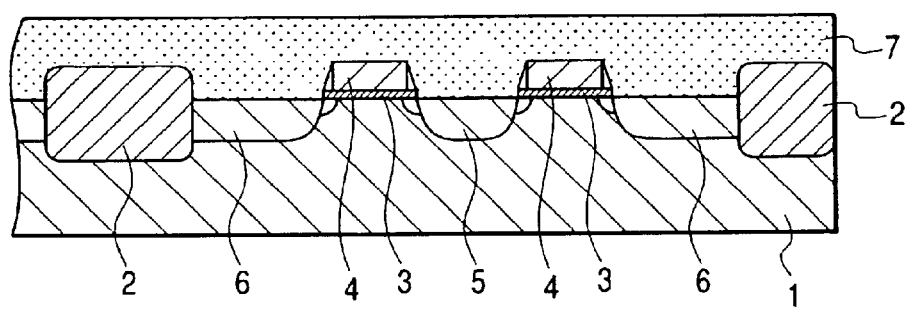
FIG. 2B is a sectional view showing the cross section taken along the line 2B—2B in FIG. 2A.

As shown in FIGS. 2A and 2B, first, grooves are dug at predetermined places on the semiconductor substrate 1 made of single crystal silicon. $SiO_2$ is deposited in the grooves by the chemical vapor deposition (CVD) method. Then, the element isolation regions 2 are formed (Step S1). The element isolation regions 2 in the present embodiment are shallow trench isolations (STI's). Then, gate electrodes 4 are formed above the semiconductor substrate 1 with the gate insulation films 3 between them. A source region 5 is formed between a pair of the gate electrodes 4, and a drain region 6 is formed between a gate electrode 4 and an element isolation region 6 by the ion implantation, respectively. For example, in the case where a selection transistor for switching is an n-channel metal oxide semiconductor (MOS), the source region 5 and the drain region 6 are formed by introducing arsenic, phosphorus or the like. In the case where the selection transistor for switching is an p-channel MOS, the source region 5 and the drain region 6 are formed by introducing boron. Thus, transistor structures are formed on the semiconductor substrate 1 (Step S2). In the present embodiment, the gate region 4 and the drain region 6 are formed on both sides of the source region 5, which is commonly used by the gate region 4 and the drain region 6, respectively. The first inter-layer insulating film 7 made of $SiO_2$ is formed by the CVD method on the semiconductor substrate 1 on which the transistor structures are formed in such a way (Step S3).

Figure 3A:
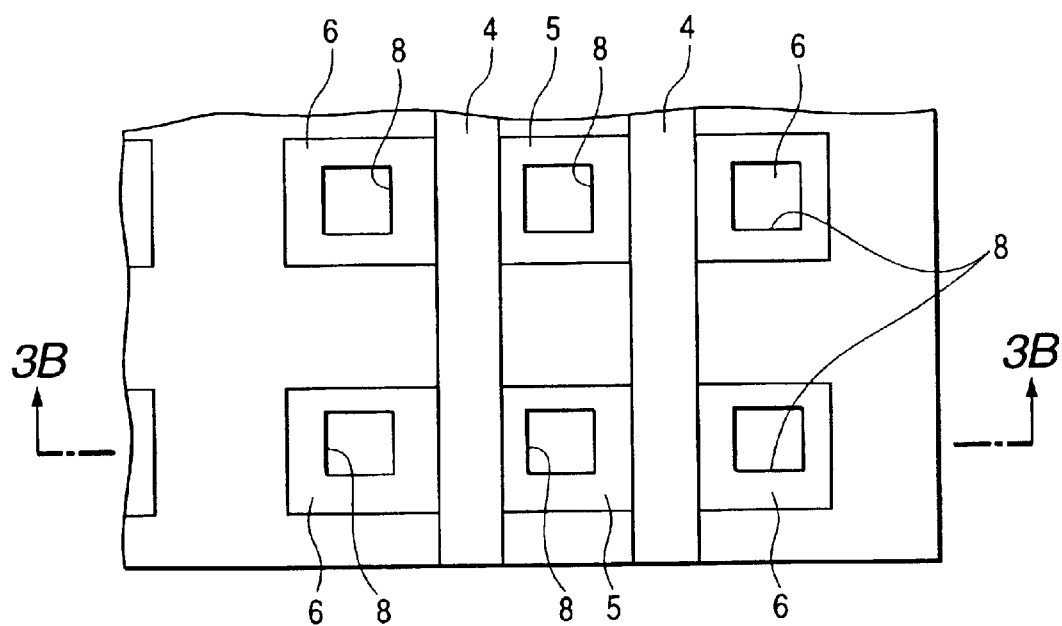
FIG. 3A is a view of a principal part in the manufacturing process of the magnetic memory device of the first embodiment.
Figure 3B:
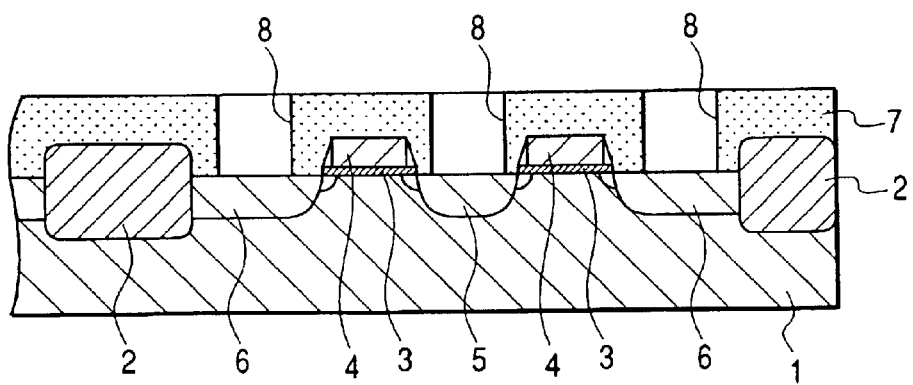
FIG. 3B is a sectional view showing the cross section taken along the line 3B—3B in FIG. 3A.

Next, as shown in FIGS. 3A and 3B, the contact holes 8 are formed by removing the first inter-layer insulating film 7 above the source regions 5 and the drain regions 6 partially by the reactive ion etching (RIE) method (Step S4).

Figure 4A:
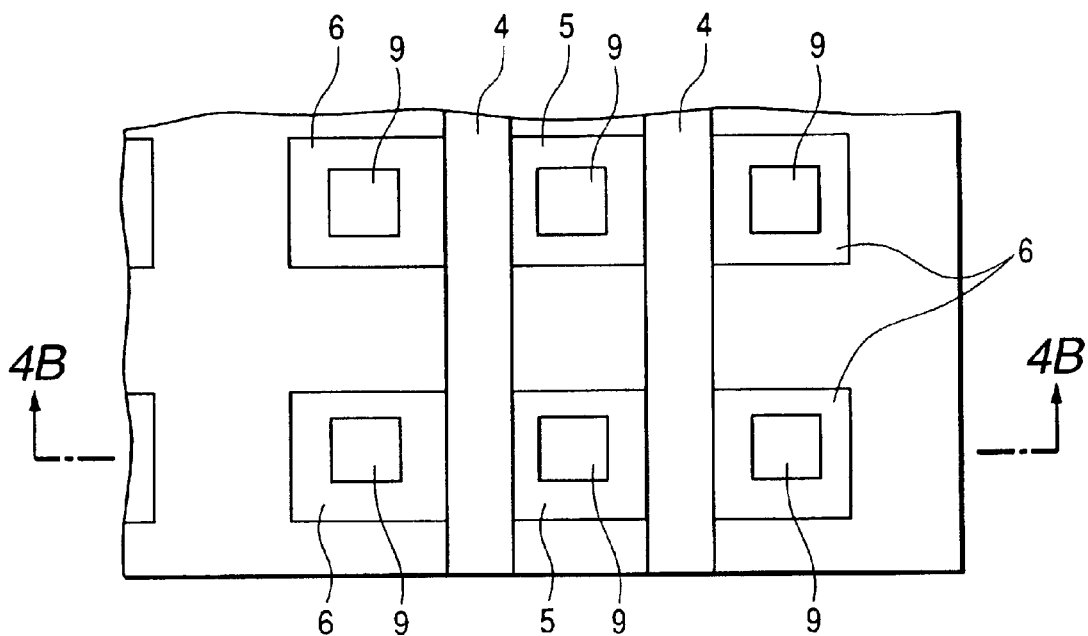
FIG. 4A is a view of a principal part in the manufacturing process of the magnetic memory device of the first embodiment.
Figure 4B:
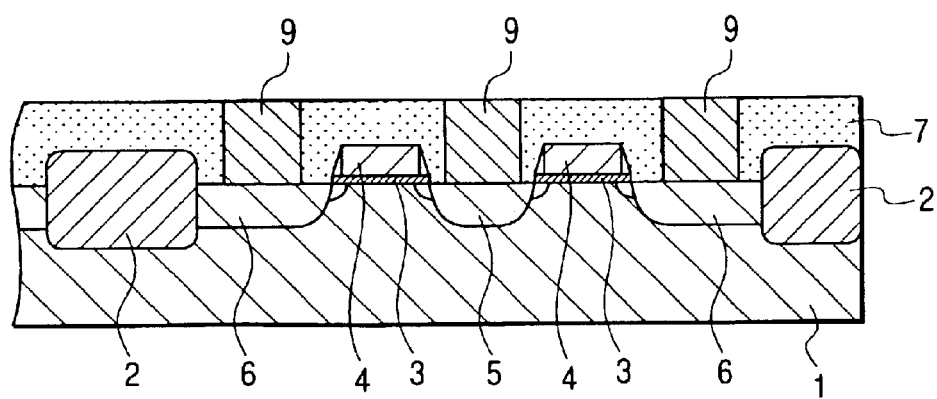
FIG. 4B is a sectional view showing the cross section taken along the line 4B—4B in FIG. 4A.

Then, as shown in FIGS. 4A and 4B, the first plugs 9 are formed by filling up the contact holes 8 with tungsten by the CVD method (Step S5). In such a state, the upper surfaces of the first inter-layer insulating film 7 and the first plugs 9 are smoothed by the chemical mechanical polishing (CMP) method (Step S6).

Figure 5A:
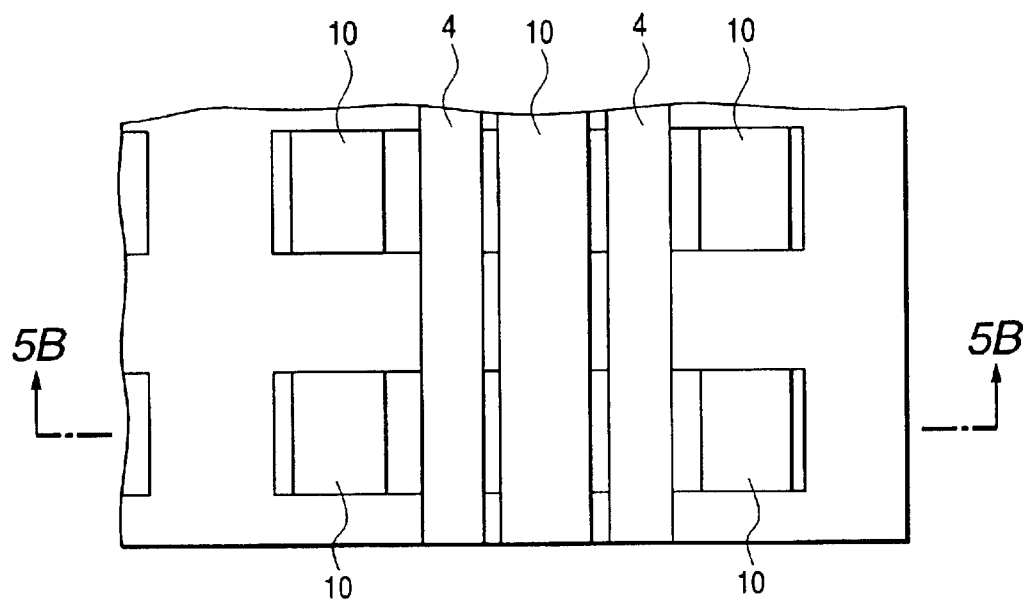
FIG. 5A is a view of a principal part in the manufacturing process of the magnetic memory device of the first embodiment.
Figure 5B:
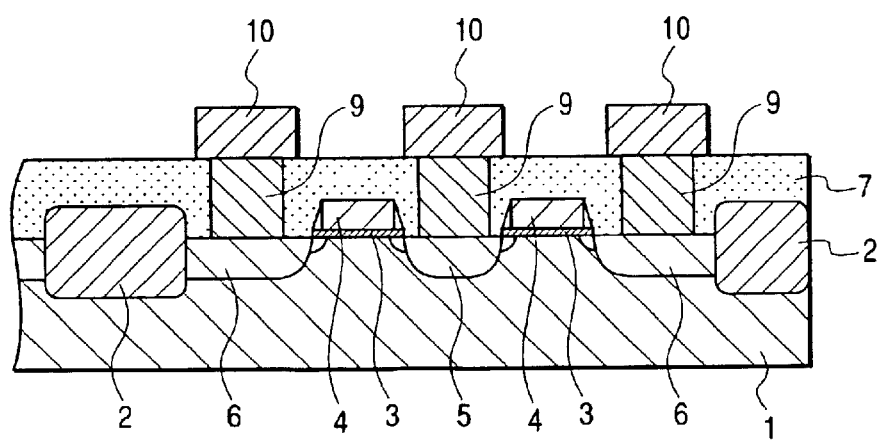
FIG. 5B is a sectional view showing the cross section taken along the line 5B—5B in FIG. 5A.

Successively, as shown in FIGS. 5A and 5B, Ti/AlSiCu/Ti layers are formed by sputtering. The formed Ti/AlSiCu/Ti layers are patterned by the RIE method. Thus, the first metal wiring 10 connected to the first plugs 9 is formed (Step S7). Although it is not described in detail, the first metal wiring 10 connected with the source regions 5 through the first plugs 9 is connected with a grounding conductor, and the first metal wiring 10 connected with the drain regions 6 through the fist plugs 9 is connected with a not shown peripheral circuit or an external circuit.

Figure 6A:
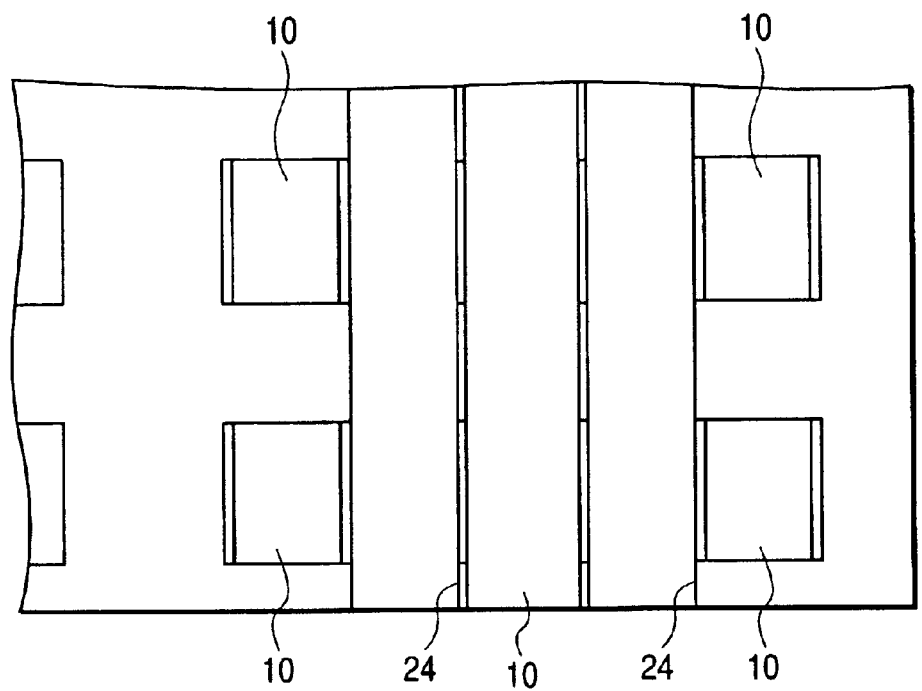
FIG. 6A is a view of a principal part in the manufacturing process of the magnetic memory device of the first embodiment.
Figure 6B:
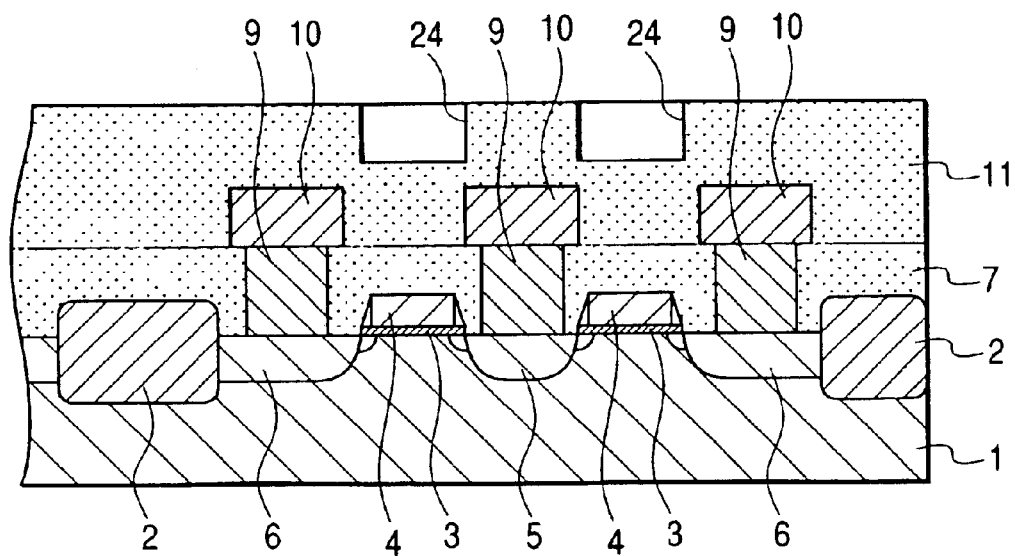
FIG. 6B is a sectional view showing a cross section of the manufacturing process of FIG. 6A.

Then, as shown in FIGS. 6A and 6B, the second inter-layer insulating film 11 made of $SiO_2$ is formed by the CVD method (Step S8). Wiring grooves 24 are formed by removing the second inter-layer insulating film 11 partially by the RIE method (Step S9).

Figure 7A:
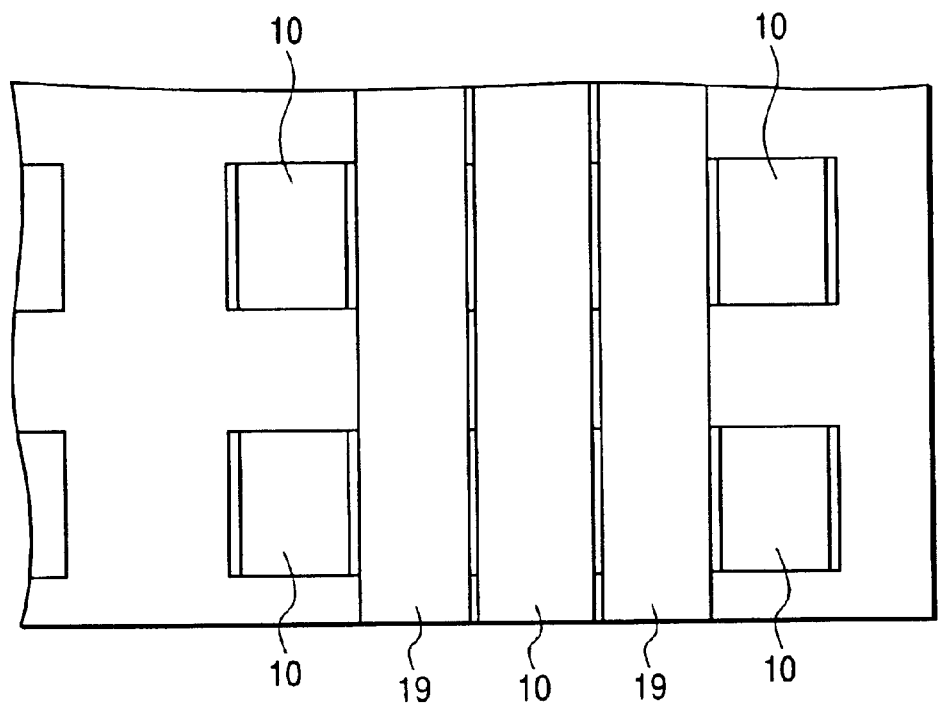
FIG. 7A is a view of a principal part in the manufacturing process of the magnetic memory device of the first embodiment.
Figure 7B:
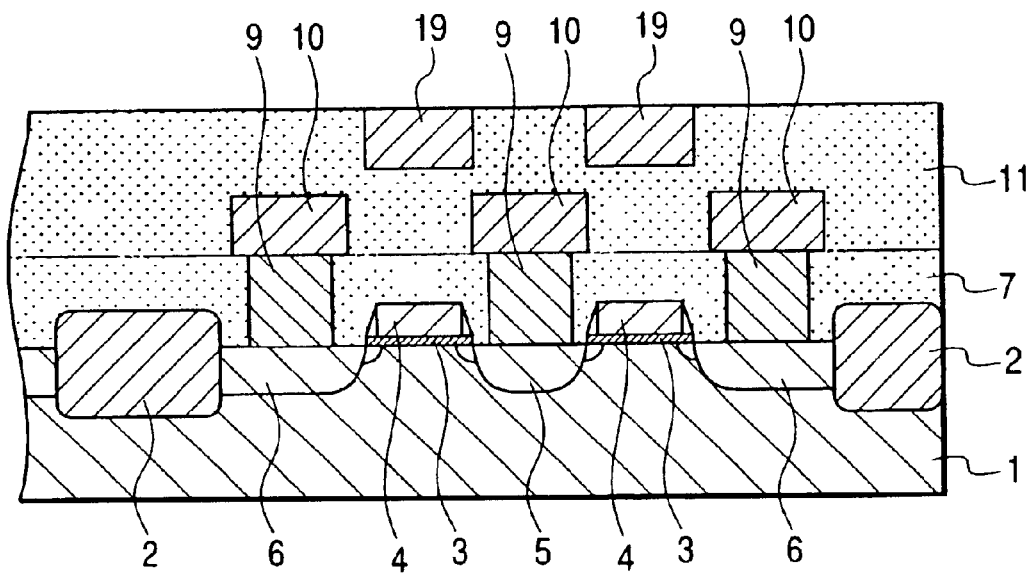
FIG. 7B is a sectional view showing a cross section of the manufacturing process of FIG. 7A.

Next, as shown in FIGS. 7A and 7B, the second metal wiring 19 made of copper is formed in the wiring grooves 24 by metal plating (Step S10). The upper surfaces of the second inter-layer insulating film 11 and the second metal wiring 19 are smoothed by the CMP method (Step S11). The second metal wiring 19 is the wiring for applying the assist magnetic fields to the TMR elements.

Figure 8A:
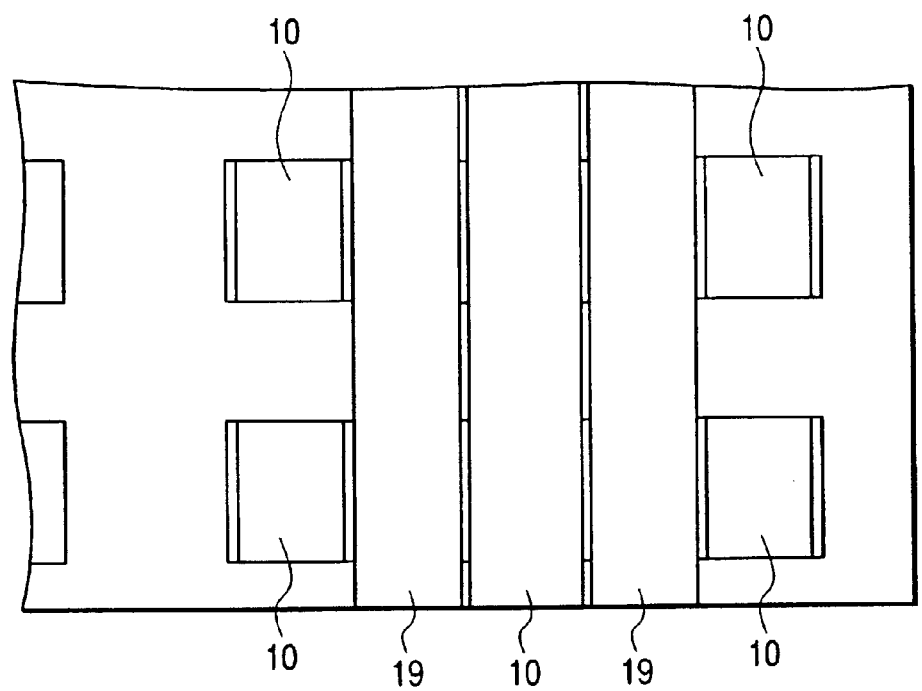
FIG. 8A is a view of a principal part in the manufacturing process of the magnetic memory device of the first embodiment.
Figure 8B:
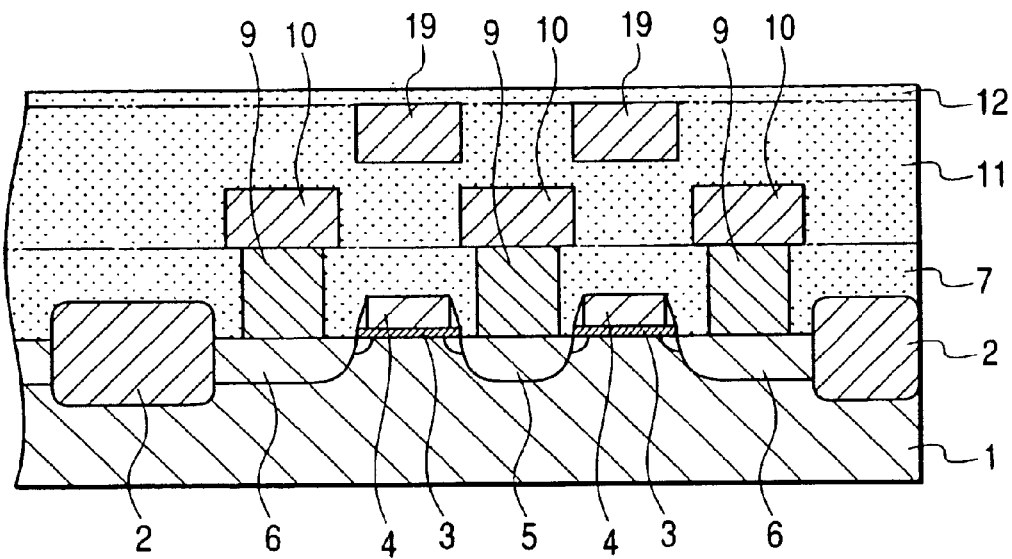
FIG. 8B is a sectional view showing a cross section of the manufacturing process of FIG. 8A.

Then, as shown in FIGS. 8A and 8B, the third inter-layer insulating film 12 made of $SiO_2$ is formed by the CVD method (Step S12). At this time, the third inter-layer insulating film 12 is formed on the second metal wiring 19 also. The thickness of the third inter-layer insulating film 12 is made to be 200 nm or less on the second metal wiring 19 for applying magnetic fields efficiently to the magnetic layers of the TMR elements 18 to be disposed at a post-process by the electric current flowing through the second metal wiring 19. Consequently, the film thickness control of the third inter-layer insulating film 12 is preformed extremely precisely.

Figure 9A:
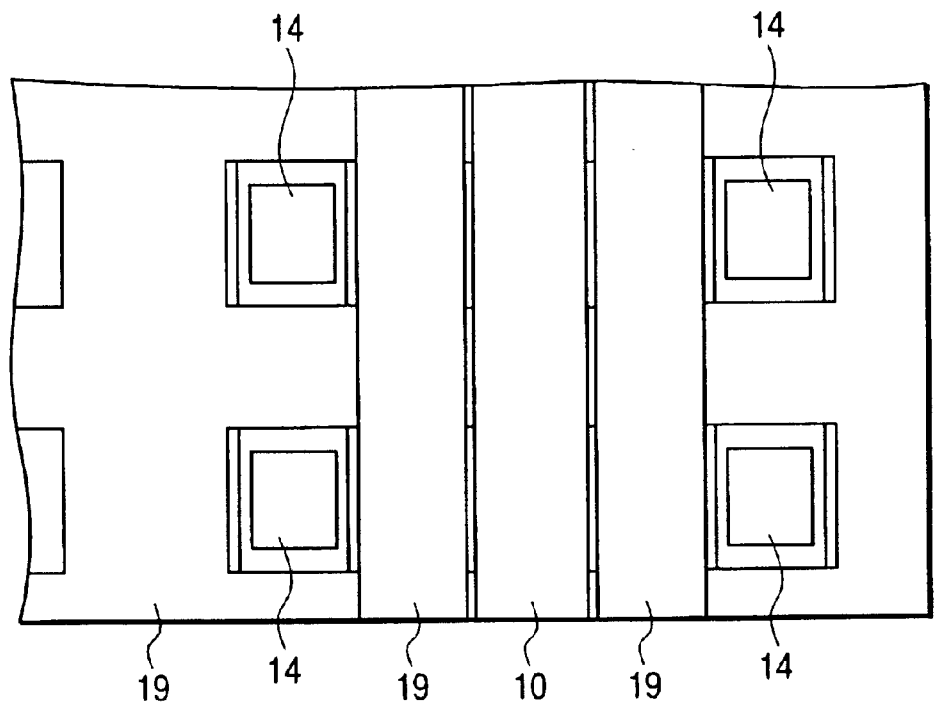
FIG. 9A is a view of a principal part in the manufacturing process of the magnetic memory device of the first embodiment.
Figure 9B:
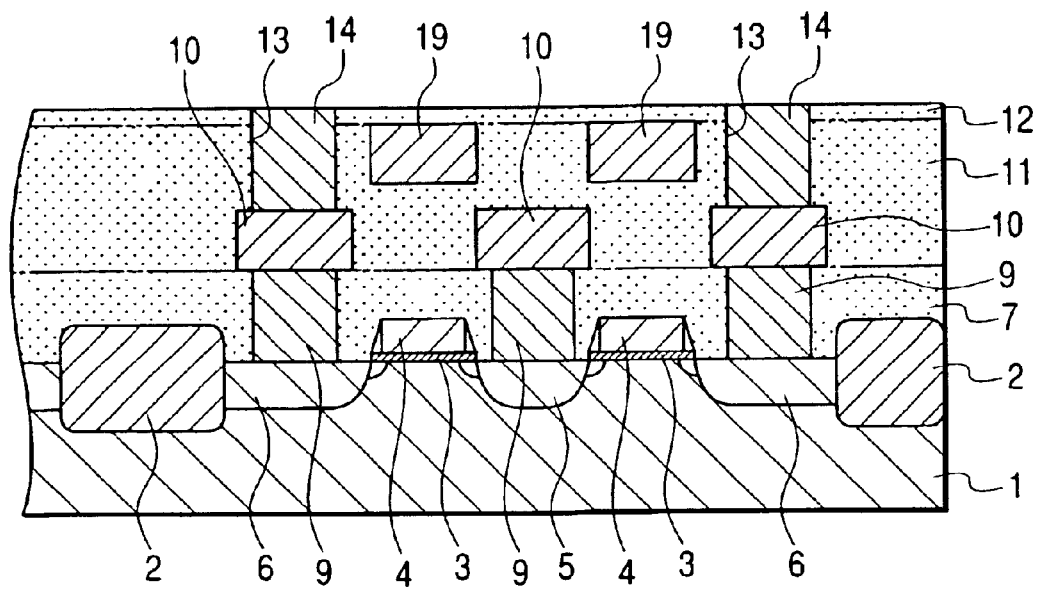
FIG. 9B is a sectional view showing a cross section of the manufacturing process of FIG. 9A.

Successively, as shown in FIGS. 9A and 9B, the third inter-layer insulating film 12 located above the first metal wiring 10 above the drain regions 6 is partially removed with high accuracy of positions by the RIE method to form the contact holes 13 (Step S13). Then, the second plugs (conductive member) 14 are formed by filling up the contact holes 13 with tungsten by the CVD method (Step S14). In this state, the upper surfaces of the third inter-layer insulating film 12 and the second plugs 14 are smoothed by the CMP method (Step S15).

Figure 10A:
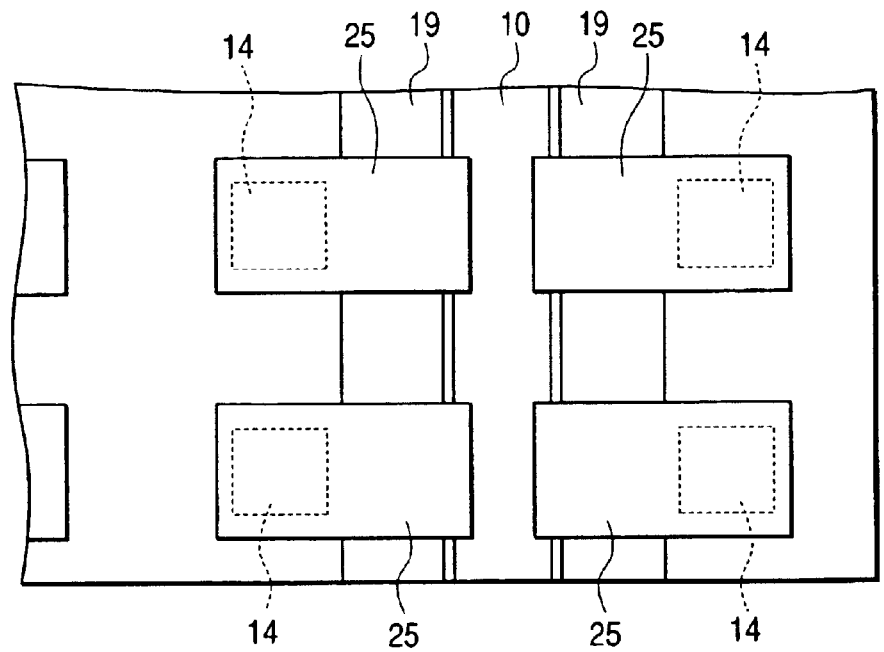
FIG. 10A is a view of a principal part in the manufacturing process of the magnetic memory device of the first embodiment.
Figure 10B:
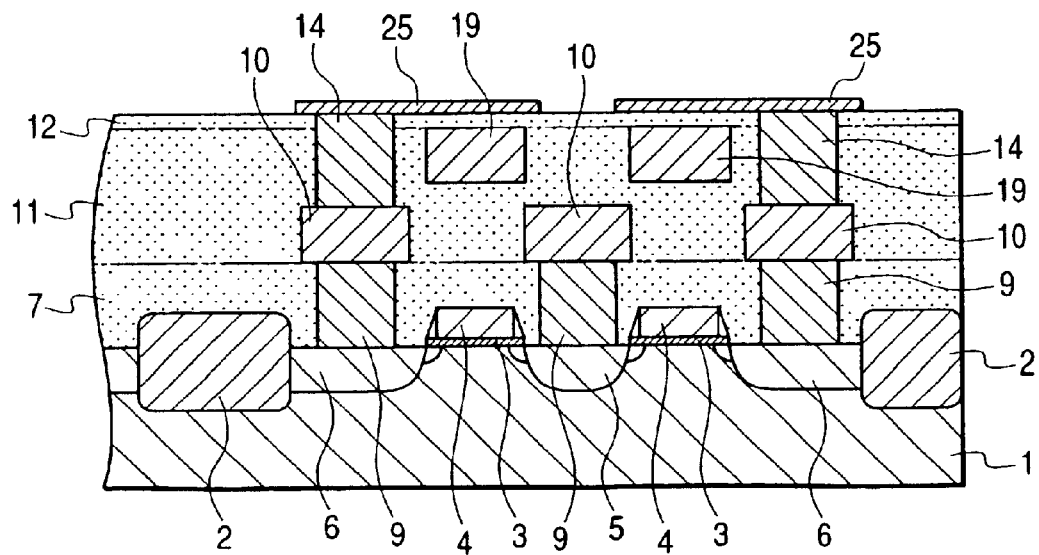
FIG. 10B is a sectional view showing a cross section of the manufacturing process of FIG. 10A.

Hereupon, as shown in FIGS. 10A and 10B, the conductive local connects 25 extending in a horizontal direction are formed on the second plugs 14 by sputtering Ti or TiN (Step S16). Then, as shown in FIGS. 11A and 11B, the TMR elements 18 are formed on the local connects 25 (Step S17). To put it concretely, GdFe being the lower magnetic layers (the second magnetic layers) 15, $AlO_x$ being the tunneling barrier layers (the non-magnetic layers) 16 and TbFe being the upper magnetic layers (the first magnetic layers) 17 are formed in order by sputtering. After that, the shapes of the laminated layers are arranged by the ion milling method. Thereby, the lower magnetic layers 15 of the TMR elements 18 are connected with the second plugs 14 through the local connects 25. Moreover, the lower magnetic layers 15 are connected with the drain regions 6 through the second plugs 14, the first metal wiring 10 and the first plugs 9. With regard to the plane distribution of the TMR elements 18, the TMR elements 18 are formed to avoid the positions right above the second plugs 14. Consequently, even if irregularities are produced on the upper surfaces of the second plugs 14, the TMR elements 18 are not influenced by the irregularities and are able to be formed to be flat.

Then, as shown in FIGS. 12A and 12B, the fourth inter-layer insulating film 20 made of $SiO_2$ is formed by the CVD method in order to fill up the TMR elements 18 (Step S18). In the state, the fourth inter-layer insulating film 20 is polished with the CMP method to expose the upper surfaces of the TMR elements 18 (Step S19).

As shown in FIGS. 1A and 1B, the fifth inter-layer insulating film 22 made of SiO$_2$ is formed by the CVD method (Step S20). Then, grooves are formed at predetermined positions in the fifth inter-layer insulating film 22 by the RIE method. And the bit lines 21 made of copper are formed in the grooves by metal plating (Step S21). The bit lines 21 are write lines for writing information in the TMR elements 18 by applying magnetic fields. Then, the upper surfaces of the fifth inter-layer insulating film 22 and the bit lines 21 are smoothed by the CMP method (Step S22). Lastly, the passivation film (protection film) 23 made of SiN is formed by the CVD method (Step S23).

In such a way, the memory cells of the present invention are completed. The magnetic memory device including the memory cells has the structure in which the TMR elements are located to be shifted from the positions right above the electrode regions of the semiconductor substrate 1. Incidentally, not shown peripheral circuits are formed in parallel with the formation of the memory cells, and then the magnetic memory device is completed. Incidentally, the material of each member and the concrete formation method thereof are not limited to the ones described above, and various variations of them can be performed.

The writing and reading of information in the magnetic memory device are described. As shown in FIG. 1A, a TMR element 18 is located at a lower position in an area locating between a pair of the bit liens 21 in a plane in the present embodiment. Moreover, the second metal wiring 19 is located right under the TMR element 18.

For example, it is supposed that both of the magnetization directions of the upper magnetic layer 17 and the lower magnetic layer 15 with the non-magnetic layer 16 put between them of the TMR element 18 are directed upward and the coercive force of the lower magnetic layer 15 is larger at the initial state. The magnetization directions of both of the magnetic layers 15 and 17 of the TMR element 18 are kept if no electric current is made to flow through the bit lines 21. Consequently, the resistance value of the TMR element 18 does not change. However, when an electric current is made to flow through the bit line 21 located on the lower side in FIG. 1A in the direction from the right to the left in the drawing and through the bit line 21 located on the upper side in FIG. 1A in the direction from the left to the right in the drawing, a magnetic field directed downward is generated especially in the upper magnetic layer 17 to change the magnetization direction of the upper magnetic layer 17. Because the coercive force of the lower magnetic layer 15 is large, the magnetization direction of the lower magnetic layer 15 does not change. As the result, the magnetization directions of both of the magnetic layers 15 and 17 are in an anti-parallel state. Consequently, the resistance value of the TMR element 18 becomes small. By detecting the change of the resistance value, the record can be read out. Incidentally, the electric current made to flow through the second metal wiring 19 is applied to the in-face direction of the TMR device 18, and does not directly influence the magnetization directions of the magnetic layers 15 and 17 which indicate the information of the logical values "0" and "1". However, the magnetic field generated by the electric current reinforces the magnetic fields generated by the electric current flowing through the bit lines 21, and can make the magnetic fields to be sufficiently strong magnetic fields for causing the change of the magnetization of the magnetic layer 17. Moreover, information may be recorded by reversing the magnetization of either of the magnetic layers 15 and 17 at the time of writing, and the information may be read out by reversing the magnetization of the other magnetic layer.

According to the present invention, because the TMR elements 18 are formed to avoid the positions right above the second plugs 14 the upper surfaces of which are easy to produce irregularities, the TMR elements can be formed to be flat. Consequently, there is no possibility that a large leakage current is generated, or that the MR ratios of the TMR elements 18 decrease. Moreover, because the connection between the TMR elements 18 and the second plugs 14 is secured by the local connects 25, it is possible that the MOSFET's and the TMR elements operate in a desired way.

Moreover, in the present embodiment, because magnetic fields can be applied in order to determine the magnetization directions of the magnetic layers 17 of the TMR elements 18 by means of the bit lines 21 located at the upper layer of the TMR elements 18, the writing and the reading of the information of the TMR elements 18 can be performed without any obstacle.

Second Embodiment

Figure 17A:
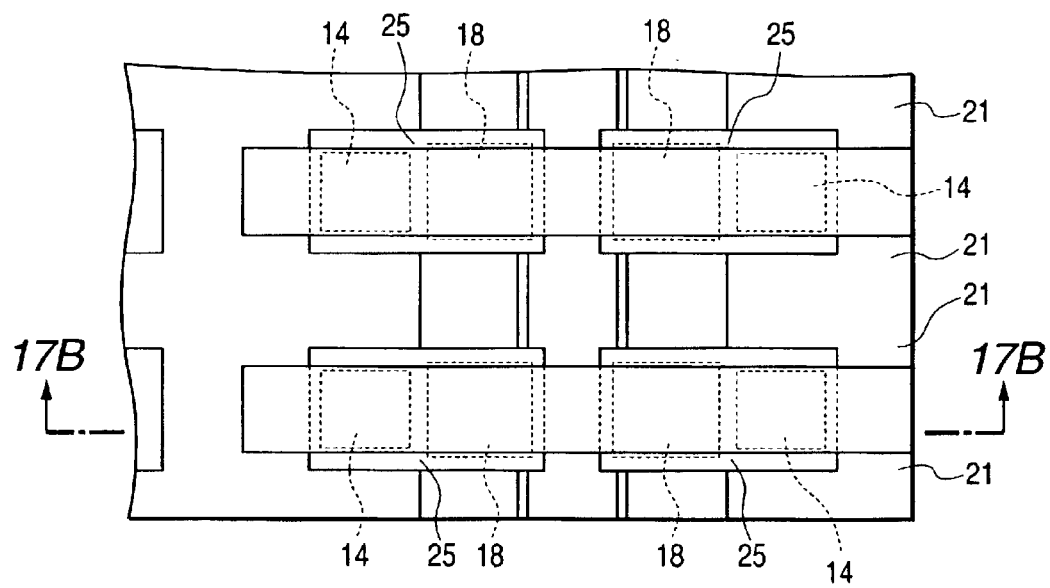
FIG. 17A is a plan view of a principal part of a magnetic memory device of a second embodiment of the present invention.
Figure 17B:
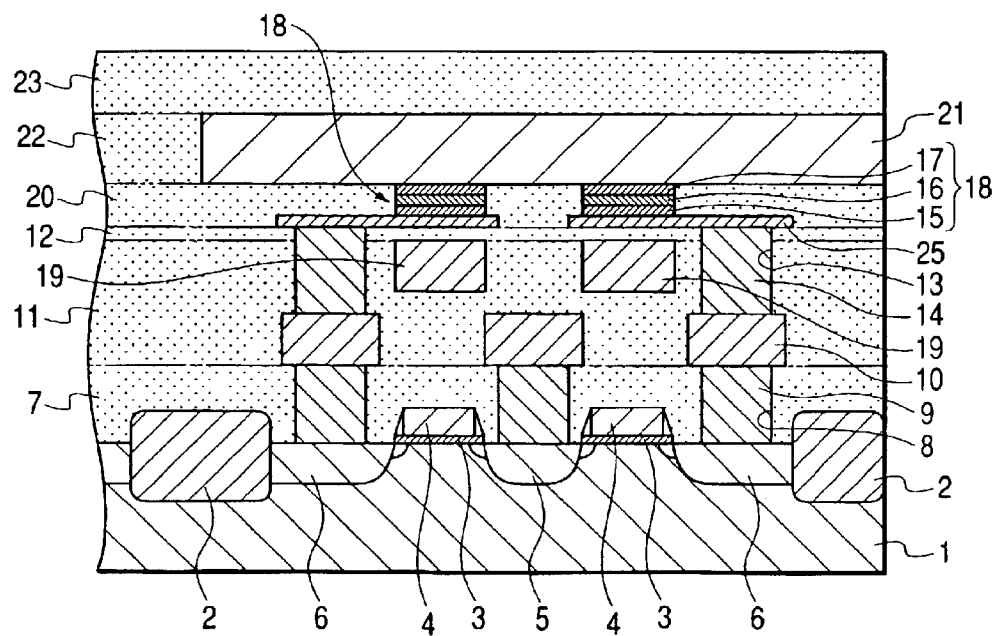
FIG. 17B is a sectional view showing the cross section taken along the line 17B—17B in FIG. 17A.

As shown in FIGS. 17A and 17B, a magnetic memory device having the structure in which the bit lines 21 were located right above the TMR elements 18 was manufactured by a method similar to that of the first embodiment.

In operation, the present embodiment differs from that of the first embodiment in the fact that the bit lines of the adjoining cell is used for applying magnetic fields in the direction perpendicular to the film surfaces of the TMR element 18.

Third Embodiment

Figure 18A:
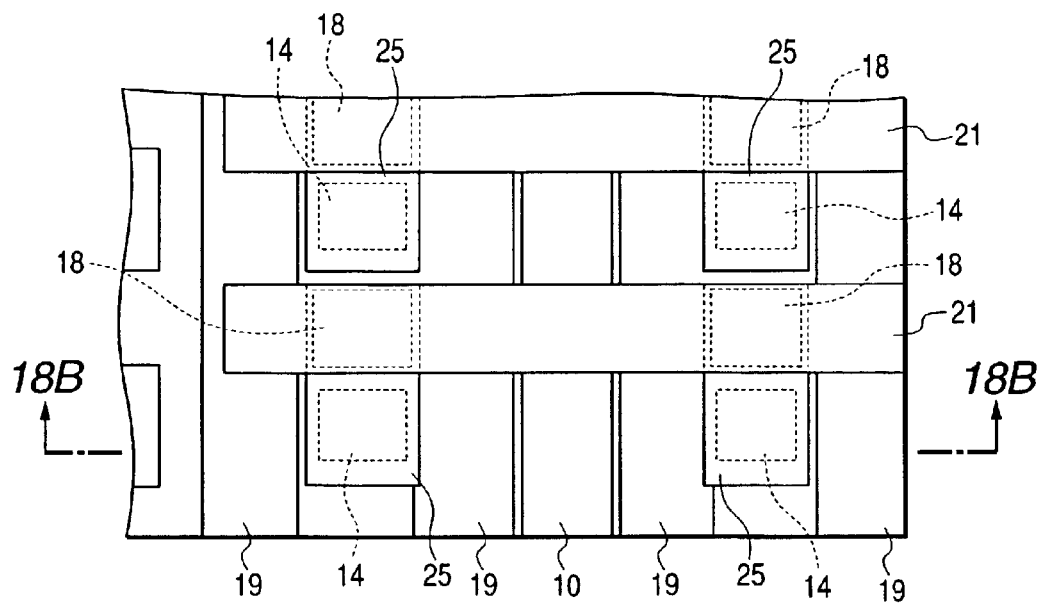
FIG. 18A is a plan view of a principal part of a magnetic memory device of a third embodiment of the present invention.
Figure 18B:
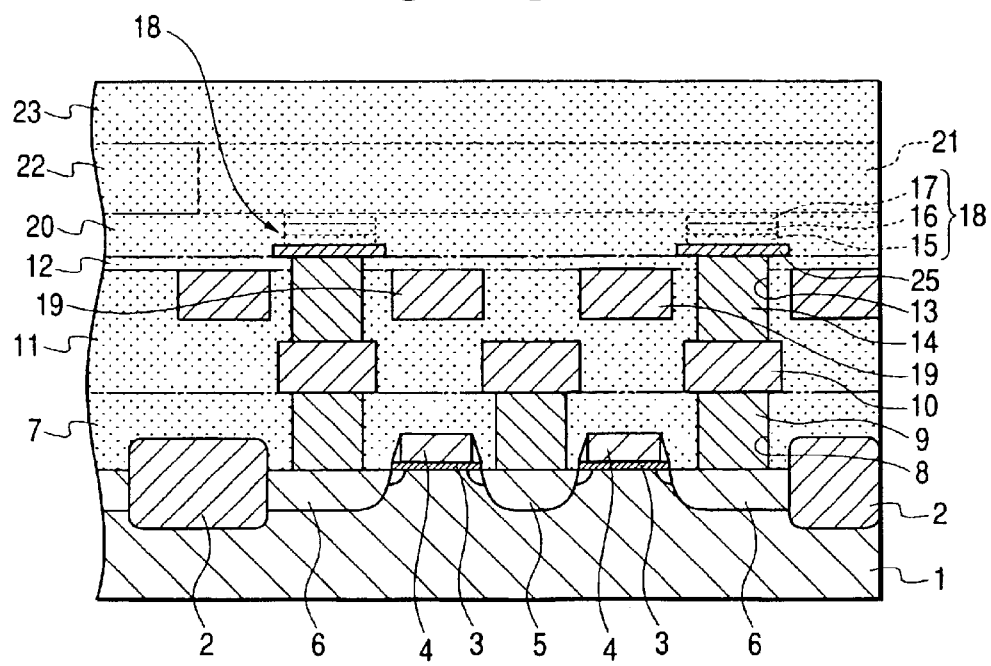
FIG. 18B is a sectional view showing the cross section taken along the line 18B—18B in FIG. 18A.

As shown in FIGS. 18A and 18B, a magnetic memory device having the structure in which the TMR elements 18 were disposed at positions shifted upward in the plan view (FIG. 18A) and the second metal wiring 19 was disposed in the lower side direction of the TMR elements 18 and further the bit lines 21 were located right above the TMR elements 18 was manufactured by a method similar to that of the first embodiment.

In operation, the present embodiment differs from that of the first embodiment in the fact that an electric current is made to flow through the second metal wiring 19 for applying magnetic fields in the directions perpendicular to the film surfaces of the TMR elements 18 and an electric current is made to flow through the bit lines 21 for applying assist magnetic fields in the in-face directions of the TMR elements 18.

Comparative Example

Figure 16:
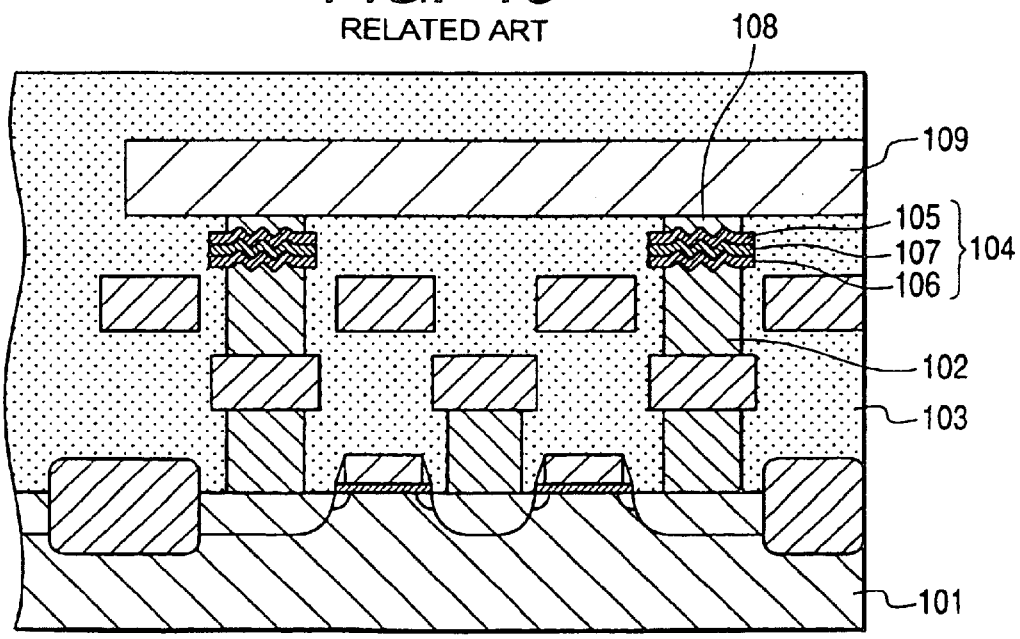
FIG. 16 is a sectional view showing a cross section of a magnetic memory device as a comparative example.

The structure of a magnetic memory device shown in FIG. 16 is described. Transistor structures are made in a semiconductor substrate 101. Conductive members (concretely, plugs 102 made of metal contacting with TMR elements 104) connecting with the drain regions of the transistor structures are formed. Then, the peripheries of the plugs 102 are covered with an inter-layer insulating film 103. In this state, the upper surfaces of the inter-layer insulating film 103 and the plugs 102 are polished. However, irregularities or steps are sometimes formed on the upper surfaces of the plugs 102 at the time of the polishing. Although the upper surface of the inter-layer insulating film 103 is made to be smooth by the polishing, irregularities are easily formed on the upper surfaces of the plugs 102. If the TMR elements 104 are laminated in such a state, the TMR elements 104 are naturally formed to be irregular shapes along the shapes of the plugs 102. Then, tunneling barrier layers (non-magnetic layers) 107 of the TMR elements 104 are not flat, and it is difficult to make the magnetization directions of upper and lower magnetic layers 105 and 106 to be ideal parallel state or anti-parallel state. Consequently, as described above, it becomes difficult to obtain stable magnetoresistance changes of the TMR elements 104. Moreover, in the case where irregularities are formed on the TMR elements 104, there is the possibility of the occurrence of a large leakage current. Incidentally, in the example shown in FIG. 16, contact holes are formed on the TMR elements 104, and a conductive material is filled in the contact holes to form plugs 108. The irregularities of the TMR elements 104 are absorbed by the plugs 108, and then bit lines 109 are formed.

Fourth Embodiment

Figure 19A:
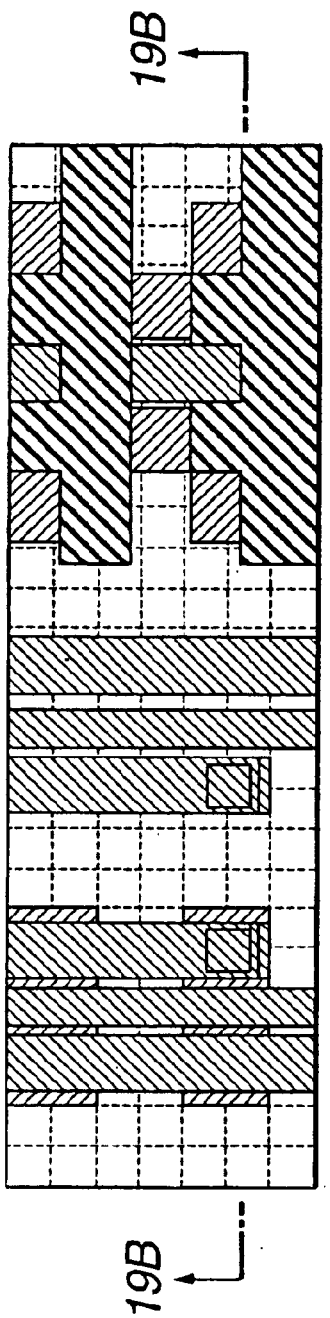
FIG. 19A is a plan view of a principal part of a magnetic memory device of a fourth embodiment of the present invention.
Figure 19B:
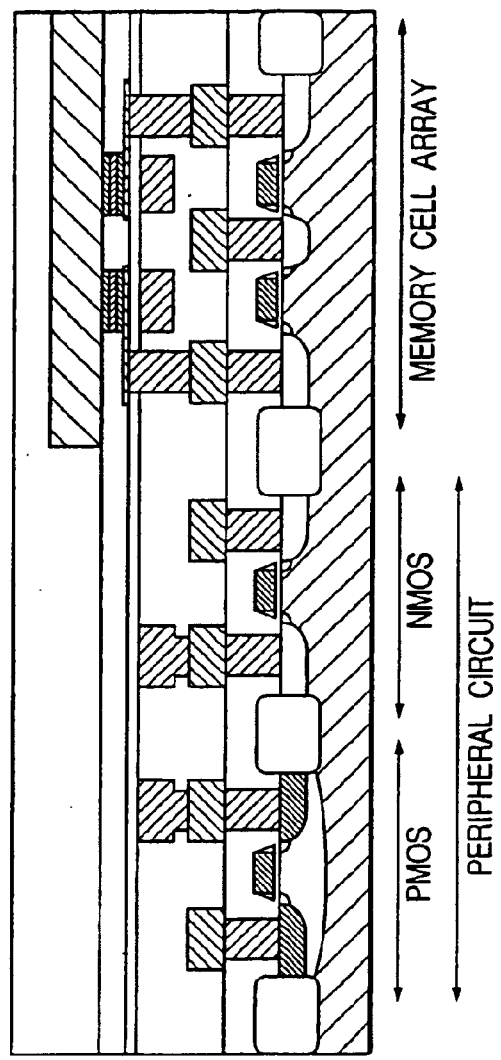
FIG. 19B is a sectional view showing the cross section taken along the line 19B—19B in FIG. 19A.

As shown in FIGS. 19A and 19B, a magnetic memory device having the structure in which the bit lines 21 were disposed at positions shifted upward in the plan view (FIG. 19A) and the second metal wiring 19 was disposed right under the TMR elements 18 was manufactured by a method similar to that of the first embodiment.

In operation, the present embodiment differs from that of the first embodiment in the fact that an electric current is made to flow through the second metal wiring 19 for applying assist magnetic fields in the in-face directions of the TMR elements 18 and an electric current is made to flow through the bit lines 21 for applying magnetic fields perpendicular to the film surfaces to determine information.

Fifth Embodiment

As shown in FIGS. 20A and 20B, a magnetic memory device having the structure in which the bit lines 21 were disposed right above of the TMR elements 18 in the plan view (FIG. 20A) and the second metal wiring 19 was disposed obliquely under the TMR elements 18 was manufactured by a method similar to that of the first embodiment.

In operation, the present embodiment differs from that of the first embodiment in the fact that an electric current is made to flow through the second metal wiring 19 for applying magnetic fields in the directions perpendicular to the face surfaces of the TMR elements 18 and an electric current is made to flow through the bit lines 21 for applying assistant magnetic fields in the in-face directions of the TMR elements 18.

What is claimed is:

1. A non-volatile magnetic memory device, comprising a magnetoresistive element composed of a first and a second magnetic layers being magnetized chiefly in a direction perpendicular to film surfaces and a non-magnetic layer located between said first and said second magnetic layers, said magnetoresistive element being connected with a conductive plug, wherein said magnetoresistive element is disposed at a position distant from said plug in a plane, and a local connect is provided for connecting an upper surface of said plug and a lower surface of said magnetoresistive element.

2. A magnetic memory device according to claim 1, wherein said local connect is made of titanium or titanium nitride.

3. A magnetic memory device according to claim 1, wherein said plug is formed in a contact hole formed in an insulating film, and is made of tungsten or copper, and further is formed to penetrate said insulating film substantially perpendicularly.

4. A magnetic memory device according to claim 1, said device further comprising a bit line at least a part of which is formed above said magnetoresistive element, said bit line being connected with said magnetoresistive device.

5. A magnetic memory device according to claim 4, said device further comprising wiring for applying a magnetic field to at least one of said magnetic layers by making an electric current flow therethrough.

6. A magnetic memory device according to claim 5, wherein magnetization of said magnetic layer is reversed by making an electric current flow through said bit line to apply a magnetic field in a direction perpendicular to film surfaces of said magnetic layer, and by making the electric current flow through said wiring to apply the magnetic field assisting the magnetic field in the direction perpendicular to said film surfaces to said magnetic layer.

7. A magnetic memory device according to claim 5, wherein magnetization of said magnetic layer is reversed by making an electric current flow through said wiring to apply the magnetic field in a direction perpendicular to film surfaces of said magnetic layer, and by making an electric current flow through said bit line to apply a magnetic field assisting the magnetic field in the direction perpendicular to said film surfaces to said magnetic layer.

8. A magnetic memory device according to claim 4, wherein said magnetoresistive element is located at a position shifted from a principal wiring part of said bit line in a plane.

9. A magnetic memory device according to claim 1, wherein said non-magnetic layer is an insulator.

10. A manufacturing method of a non-volatile magnetic memory device comprising a magnetoresistive element composed of a first and a second magnetic layers being magnetized chiefly in a direction perpendicular to film surfaces and a non-magnetic layer located between said first and said second magnetic layers, said magnetoresistive element being connected with a conductive plug, said method comprising the steps of:

forming said plug;

forming a conductive local connect contacting with an upper surface of said plug and extending to a horizontal direction; and forming said magnetoresistive element at a position distant from a position right above an upper surface of said plug in a plane on said local connect.

11. A manufacturing method of a non-volatile magnetic memory device according to claim 10, wherein said local connect is formed by use of titanium or titanium nitride.

12. A manufacturing method of a non-volatile magnetic memory device according to claim 10, said method further comprising the step of forming a bit line connected with said magnetoresistive element above said magnetoresistive element.

13. A manufacturing method of a non-volatile magnetic memory device according to claim 12, wherein said bit line is formed at a position shifted from a position right above said magnetoresistive element in a plane.

* * * * *

UNITED STATES PATENT AND TRADEMARK OFFICE
CERTIFICATE OF CORRECTION

PATENT NO. : 6,703,676 B2
DATED : March 9, 2004
INVENTOR(S) : Tadahiko Hirai et al.

It is certified that error appears in the above-identified patent and that said Letters Patent is hereby corrected as shown below:

Column 1,
Line 55, "of them" should be deleted.

Column 2,
Line 23, "instable." should read -- unstable. --
Line 66, "is" should read -- are --.

Column 3,
Lines 28, 41 and 63 "is" (second occurrence) should read -- be --.
Lines 34 and 43, "comprises" should read -- comprise --.
Line 36, "is" should read -- be --.

Column 6,
Line 32, "of" should be deleted.

Column 7,
Line 46, "an" should read -- a --.

Column 8,
Line 32, "preformed" should read -- performed --.

Column 9,
Line 30, "locating" should read -- located --.
Line 66, "to" should be deleted.

UNITED STATES PATENT AND TRADEMARK OFFICE
CERTIFICATE OF CORRECTION

PATENT NO. : 6,703,676 B2
DATED : March 9, 2004
INVENTOR(S) : Tadahiko Hirai et al.

It is certified that error appears in the above-identified patent and that said Letters Patent is hereby corrected as shown below:

Column 11,
Line 8, "to be" should read -- be in an --.

Signed and Sealed this

Eighth Day of February, 2005

JON W. DUDAS
*Director of the United States Patent and Trademark Office*